United States Patent
Yu et al.

(10) Patent No.: US 8,696,930 B2
(45) Date of Patent: Apr. 15, 2014

(54) SILICON WAFER RECLAMATION PROCESS

(75) Inventors: Tai-Yung Yu, Rende (TW); Yu-Sheng Su, Tainan (TW); Li-Te Hsu, Shanhua (TW); Jin-Lin Liang, Alian (TW); Pin-Chia Su, Shanhua (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 606 days.

(21) Appl. No.: 12/952,540

(22) Filed: Nov. 23, 2010

(65) Prior Publication Data

US 2011/0062375 A1    Mar. 17, 2011

Related U.S. Application Data

(62) Division of application No. 11/931,796, filed on Oct. 31, 2007, now Pat. No. 7,851,374.

(51) Int. Cl.
*C09K 13/08* (2006.01)
(52) U.S. Cl.
USPC ........................................................ 252/79.3
(58) Field of Classification Search
USPC ........................................................ 252/79.3
See application file for complete search history.

(56) References Cited

U.S. PATENT DOCUMENTS

| | | | |
|---|---|---|---|
| 6,136,613 A | 10/2000 | Lin et al. | |
| 6,140,211 A | 10/2000 | Nanda et al. | |
| 6,406,923 B1 | 6/2002 | Inoue et al. | |
| 6,458,712 B2 | 10/2002 | Kramer et al. | |
| 6,547,647 B2 | 4/2003 | Chang | |
| 6,761,625 B1 | 7/2004 | Rojhantalab et al. | |
| 6,890,391 B2 | 5/2005 | Aoki et al. | |
| 7,008,874 B2 | 3/2006 | Falster | |
| 7,250,391 B2 | 7/2007 | Kanno et al. | |
| 2002/0086539 A1 | 7/2002 | Falster | |
| 2004/0235390 A1 | 11/2004 | Rojhantalab et al. | |
| 2005/0092349 A1 | 5/2005 | Suzuki et al. | |
| 2005/0248004 A1 | 11/2005 | Chang et al. | |
| 2005/0250277 A1 | 11/2005 | Chang et al. | |
| 2006/0009011 A1 | 1/2006 | Barrett et al. | |
| 2006/0138399 A1* | 6/2006 | Itano et al. | 257/40 |
| 2006/0199749 A1 | 9/2006 | Suzuki et al. | |
| 2007/0007245 A1 | 1/2007 | Uchida et al. | |
| 2007/0096091 A1 | 5/2007 | Wang | |
| 2007/0151949 A1 | 7/2007 | Jian et al. | |
| 2008/0261847 A1 | 10/2008 | Visintin et al. | |

FOREIGN PATENT DOCUMENTS

WO    0031785    6/2000

OTHER PUBLICATIONS

Official Action issued Mar. 1, 2012 in counterpart Taiwan patent application.

* cited by examiner

*Primary Examiner* — Roberts Culbert
(74) *Attorney, Agent, or Firm* — Duane Morris LLP

(57) ABSTRACT

An etchant for removing a porous low-k dielectric layer on a semiconductor substrate includes a hydrofluoric acid-based solvent, a dilating additive for dilating the pores in the porous low-k dielectric, and a passivating additive that forms a passivation layer at the interface between the low-k dielectric layer and the semiconductor substrate.

7 Claims, 6 Drawing Sheets

SILICON WAFER RECLAMATION PROCESS

CROSS-REFERENCE TO RELATED APPLICATIONS

This application is a divisional application of the co-pending U.S. patent application Ser. No. 11/931,796, filed on Oct. 31, 2007, the disclosure of which is incorporated herein by reference in its entirety.

BACKGROUND

1. Field of the Invention

The present invention relates to a process for reclaiming a silicon wafer substrate from a semiconductor wafer for reusing the silicon wafer as control wafers.

2. Description of the Related Art

In modern semiconductor device technology, low-k dielectric material has been used to replace traditional silicon diode oxide as the inter-metal dielectric layers to improve the electrical performance of the semiconductor devices by suppressing signal-propagation delay, cross-talk between metal lines and power consumption due to their low dielectric constants. One of the promising low-k dielectric material is the trimethylsilane (TMS)-based dielectric material. The TMS-based dielectric material is an organosilicate glass with a dielectric constant as low as about 2.1.

Prior to forming a low-k dielectric layer on production wafers, the low-k dielectric layer usually is deposited on a control wafer to assure that physical and electrical characteristics of the low-k dielectric layer satisfy process requirements. Once these characteristics of the low-k dielectric layer deposited on the control wafer are verified to be within the desired range defined by the process specifications, the same recipe is used for the test wafer is set up to process the production wafers. After being processed, the control wafer must be transferred to a cleaning station where the low-k dielectric layer is removed and the control wafer's silicon substrate is recycled to be used again as a control wafer. This is also known as a reclaim procedure of control wafers.

FIG. 6 shows a cross-sectional view of a control wafer according to a conventionally known procedure for reclaiming control wafer. A traditional reclaim procedure of control wafers includes using HF or $H_2SO_4$ to remove the low-k dielectric layer. The traditional reclaim procedure results in residue 105 of the low-k dielectric material on the control wafer 100 as shown in FIG. 6. Residue 105 on the top surface of the control wafer 100 affects the deposition of low-k dielectric layers on the control wafer 100 during subsequent reuse of the control wafer 100. As a consequence, because the reclaimed control wafer substrate 100 is not representative of the virgin production wafer, the process recipe generated using the process parameters measured on the reclaimed control wafer would not be useful to run production wafers.

Other known methods involve removing the low-k dielectric layer from the control wafers by sandblasting or polishing. These mechanical removal process, however, remove some amount of the underlying silicon wafer substrate at each reclaim cycle and thus limit the number of times the control wafer substrate can be recycled.

SUMMARY

According to an embodiment, a method for recycling a semiconductor control wafer having a porous low-k dielectric layer deposited thereon, wherein the low-k-dielectric layer contains a plurality of pores is disclosed. The method comprises dilating the pores in the low-k dielectric layer, forming a passivating layer at the interface between the low-k dielectric layer and the control wafer's semiconductor substrate, etching away the low-k dielectric layer safely without damaging the semiconductor substrate, and then removing the passivating layer by de-ionized water rinse leaving behind a clean silicon wafer substrate that can be reused as a control wafer.

The innovative method disclosed herein is less expensive than the conventional control wafer reclamation process and it is suitable for all new low-k dielectric film control wafers wherein the low-k dielectric film has pores for reducing the dielectric constant. The method is also suitable for all silicon-based substrate control wafers as well as gallium arsenide-based substrate control wafers.

BRIEF DESCRIPTION OF THE DRAWINGS

The features shown in the above referenced drawings are illustrated schematically and are not intended to be drawn to scale nor are they intended to be shown in precise positional relationship. Like reference numbers indicate like elements.

DETAILED DESCRIPTION

Figure 1:
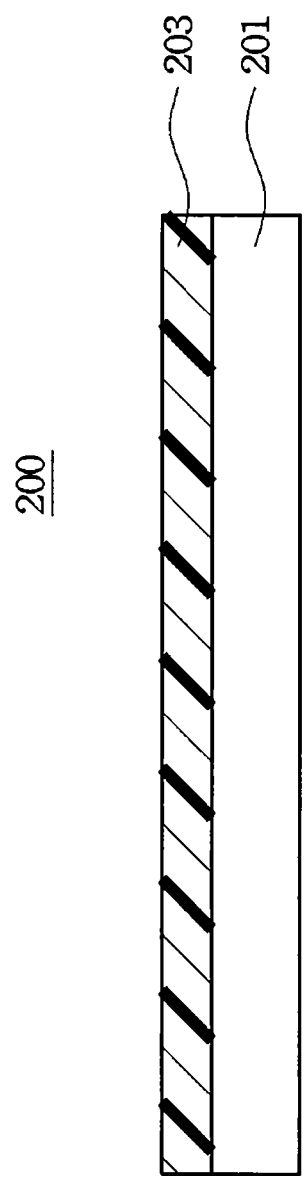
FIG. 1 is a cross-sectional view of an exemplary control wafer with a low-k dielectric layer provided thereon.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a cross-sectional view of an exemplary control wafer 200 that has been processed to characterize a process for forming a low-k dielectric layer 203. The control wafer 200 at this stage comprises a wafer substrate 201 with the low-k dielectric layer 203 thereon. The substrate 201 is usually a semiconductor material and can be, for example, a silicon-based substrate, a III-V compound substrate, a glass substrate, a gallium arsenide substrate, a printed circuit board (PCB) or any other substrate similar thereto. In this example, the substrate 201 is a single-crystal silicon wafer.

The low-k dielectric material layer 203 includes a short-chain structure. The short-chain structure includes short-chain polymers that are adapted to be dissolved in organic solvents. The low-k dielectric material layer 203 can be an organosilicate material. In some embodiments, the organosilicate material comprises a methyl-based dielectric material, a trimethylsilane-based dielectric material, a tetramethylsilane-based dielectric material, tetramethylcyclotetrasiloxane, dimethyldimethoxysilane by Dow Corning of Midland, Mich., or tetrarnethylcyclotetrasiloxane, diethylmethoxysilane or (porous silica) Meso-ELK provided by AIR PRODUCTS & CHEMICAL CO. of Allentown, Pa., BLOk, BLOk II, BD, or NFARL.

To further reduce the low-k dielectric material's dielectric constant, very small, uniformly dispersed pores or voids are formed in the dielectric layer. In general, such porous dielectric materials are prepared by incorporating removable porogens into the dielectric material, disposing the dielectric material containing the porogens onto a substrate, curing the dielectric material and then removing the porogens to form a porous dielectric layer.

Figure 2:
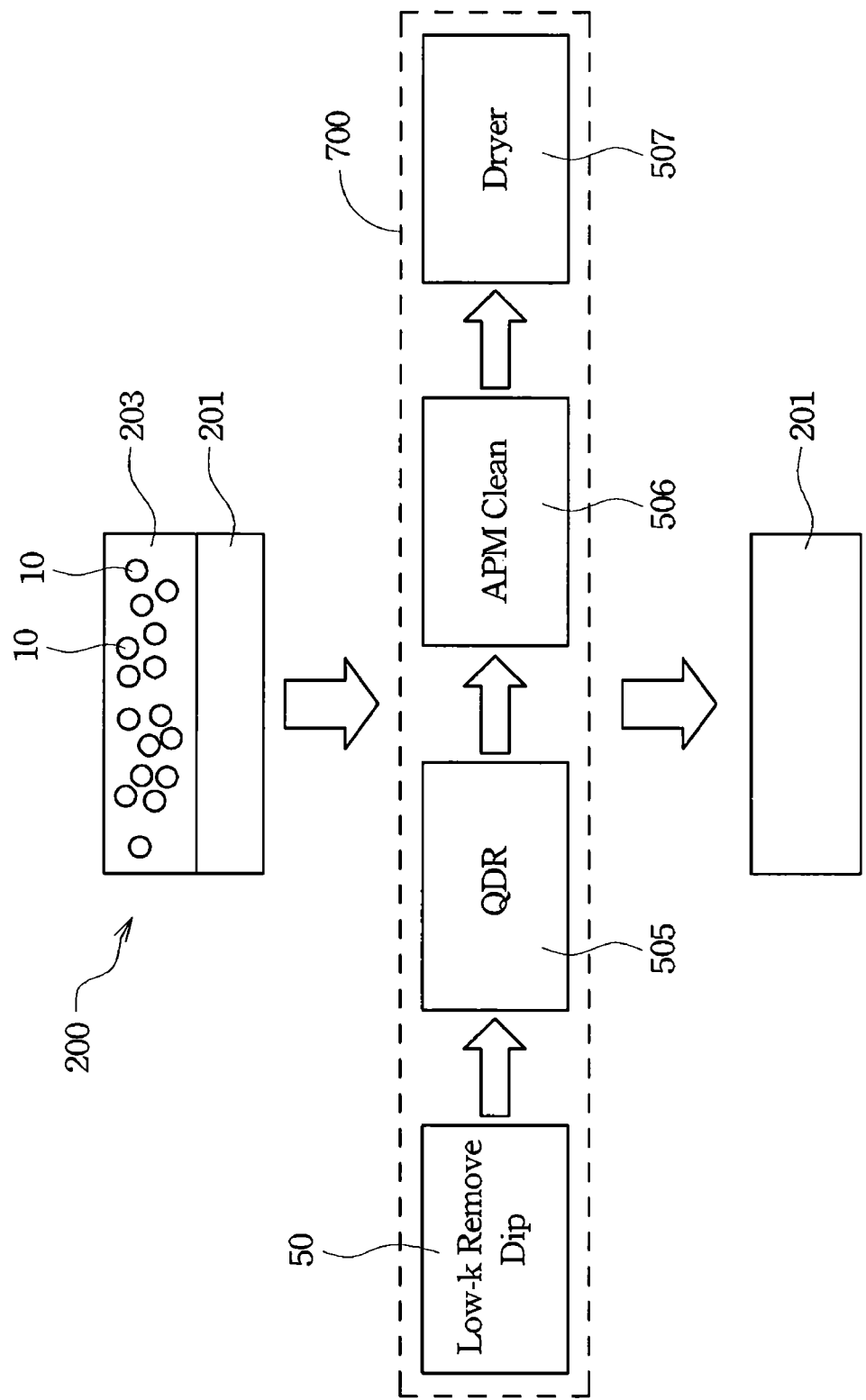
FIG. 2 is a block diagram of the method according to an aspect of the invention.

FIG. 2 is a block diagram showing the method of reclaiming a control wafer 200 according to an embodiment of the invention. The control wafer 200 comprises a silicon-based substrate 201 with a porous low-k dielectric layer 203 provided thereon. The low-k dielectric layer 203 contains a plurality of pores 10. The control wafer 200 is first processed through a low-k dielectric removal dip 50 followed by a QDR (quick de-ionized water rinse) 505, APM clean 506 and drying 507 cycles. In one embodiment, these steps can be implemented in a conventional wet bench cleaning chamber 700, such as KAIJO wet bench. At the end of this process, a clean reusable substrate 201 remains.

Figure 3:
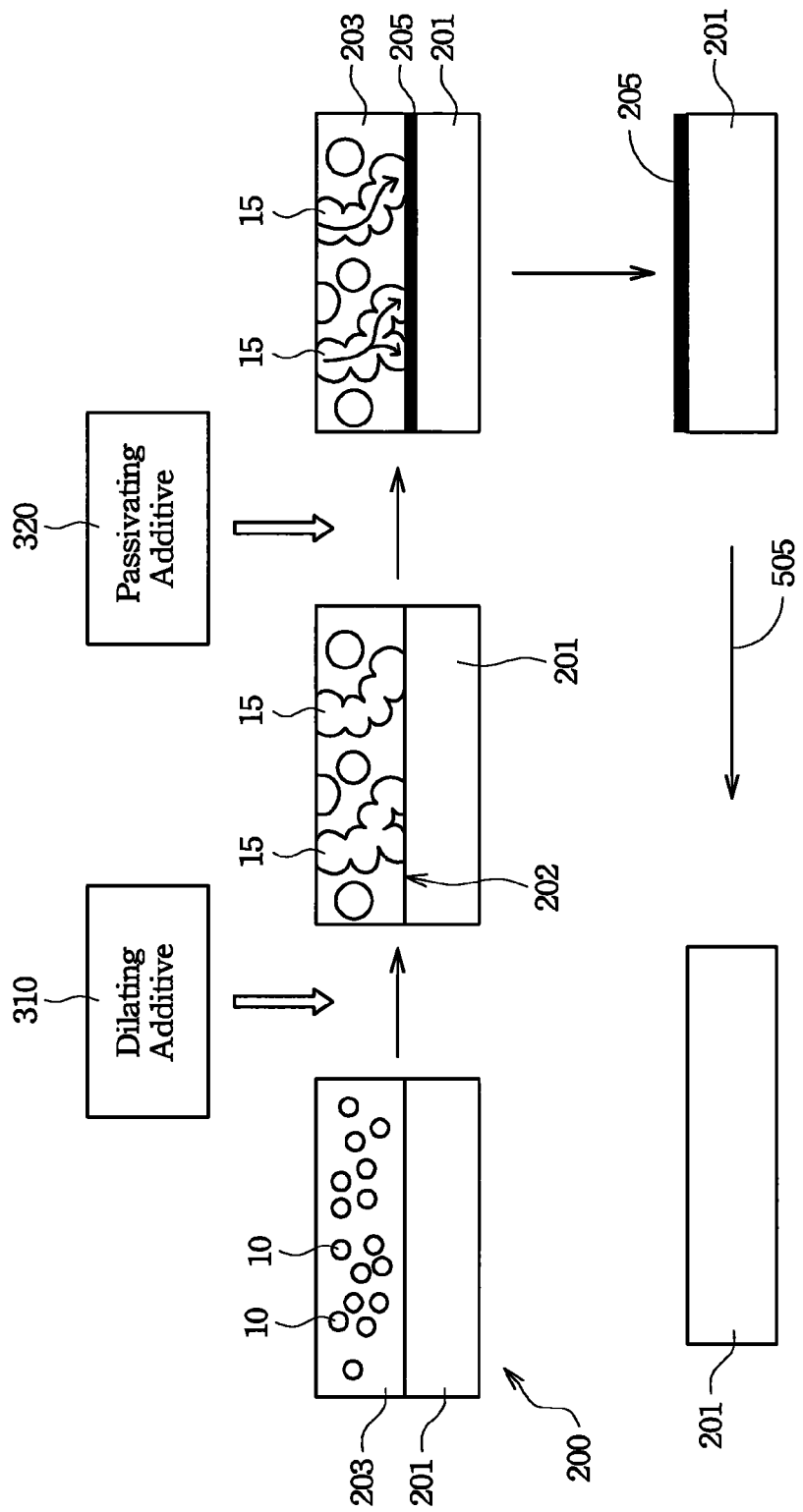
FIG. 3 is a block diagram showing the details of the method according to an aspect of the invention.

Referring to FIG. 3, the details of what happens during the low-k dielectric removal dip cycle 50 of FIG. 2 will be described. According to an aspect of the invention, the low-k dielectric removal dip 50 utilizes an hydrofluoric acid-based etching solvent for dipping the control wafer 200. The hydrofluoric acid-based etching solvent can be halo-hydrocarbon, halo-aromatic compounds or hydro-aromatic compounds and according to an aspect of the invention the etchant further comprises two additives, a dilating additive 310 and a passivating additive 320. While the control wafer 200 is dipped in the hydrofluoric acid-based solvent, the dilating additive 310 first dilates the pores 10.

Figure 4:
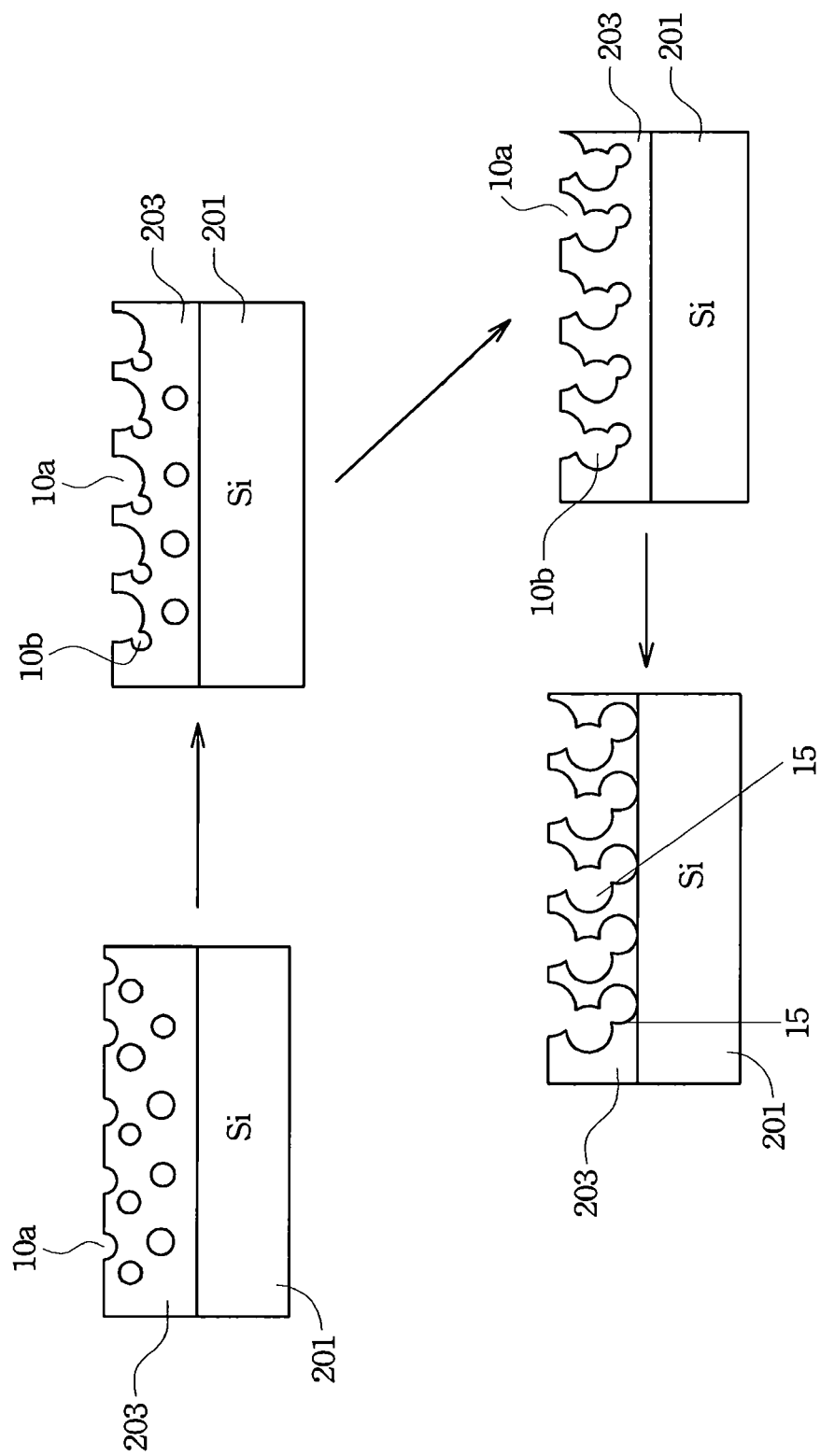
FIG. 4 is a block diagram showing additional details of the method according to an aspect of the invention.

FIG. 4 shows this dilating process in more detail. First, the dilating additive 310 dilates the upper pores 10a of the low-k dielectric material 203 that are open at the surface. As the upper pores 10a dilate, they eventually connect with other pores 10b that are nearby and deeper within the low-k dielectric material 203. The hydrofluoric acid-based solvent then flows down to these newly connected pores and the dilating additive 310 will start to dilate these new set of pores 10b. This process continues until sufficient numbers of dilated pores are connected to form a plurality of channels 15 extending from the top surface of the low-k dielectric to the substrate 210 through the thickness of the low-k dielectric. The class of glycol ethers are suitable for the dilating additive 310. Some examples are 1-(2-butoxyethoxy)ethanol and butoxydiglycol (BDG), Diethylene Glycol Monomethyl Ether ($CH_3$—($OCH_2CH_2$)$_2$—OH) (MDG), Polyethylene-Glycol Monomethyl Ether ($CH_3$—($OCH_2CH_2$)$_n$—OH) (MPG). Dilating the pores 10 allows some of the pores to connect to one another and form a plurality of channels 15 that extend from the top surface of the low-k dielectric layer 203 down to the interface 202 between the dielectric layer 203 and the substrate 201. The channels 15 allow the dipping solvent to reach down to the substrate and the passivation additive 320 in the dipping solvent will form an organic passivation layer 205 at the interface 202. Suitable solvents for the passivation additive 320 are PEG poly(ethylene glycol), EG (Ethylene Glycol), 1,4-dioxane, and Glycerin.

During the dipping cycle 50, as the dilation of the pores 10 and the formation of the passivation layer 205 is occurring, the hydrofluoric acid-based solvent simultaneously etches the low-k dielectric material 203 and is completely etched away by the end of the low-k removal dipping cycle 50. Depending on the particular type and the thickness of the low-k dielectric layer the dipping cycle can vary from about 60 seconds to 600 seconds and the solvent temperature can be between from about 23° C. (room temperature) to about 60° C. For low-k dielectric material Black Diamond, available from Applied Materials of Santa Clara, Calif., of thickness 6400 Å, the low-k removal dip 50 is for about 600 seconds at about 60° C.

The concentration of hydrofluoric acid-based required to etch the low-k dielectric material is generally sufficiently high and will etch the underlying semiconductor substrate 201. However, the passivation layer 205 protects the underlying semiconductor substrate material 201 throughout the 600 seconds of dipping cycle 50.

According to an embodiment, the hydrofluoric acid-based solvent further comprises an oxidizer. The oxidizer can be organic or inorganic, such as Pyridinium chlorochromate (PCC) $C_5H_5NHClCrO_3$; Pyridinium dichromate (PDC) $(C_5H_5NH)_2Cr_2O_7$; persulfuric acid, sulfolane; and inorganic compounds such as $HNO_3$; $H_2O_2$; and $H_2SO_5$. An example of the etchant is HF; 1,4-dioxane; 1-(2-butoxyethoxy)ethanol, butoxydiglycol (BDG), and sulfolane. During the etching process, the passivation layer 205 protects the Si substrate 201 from the etchant.

In next step 504, the passivation layer 205 is removed by quick de-ionized water rinse (QDR). After the passivation layer 205 is removed, the process leaves behind a clean undamaged Si substrate 201 that is ready to be used again as a control wafer.

Figure 5:
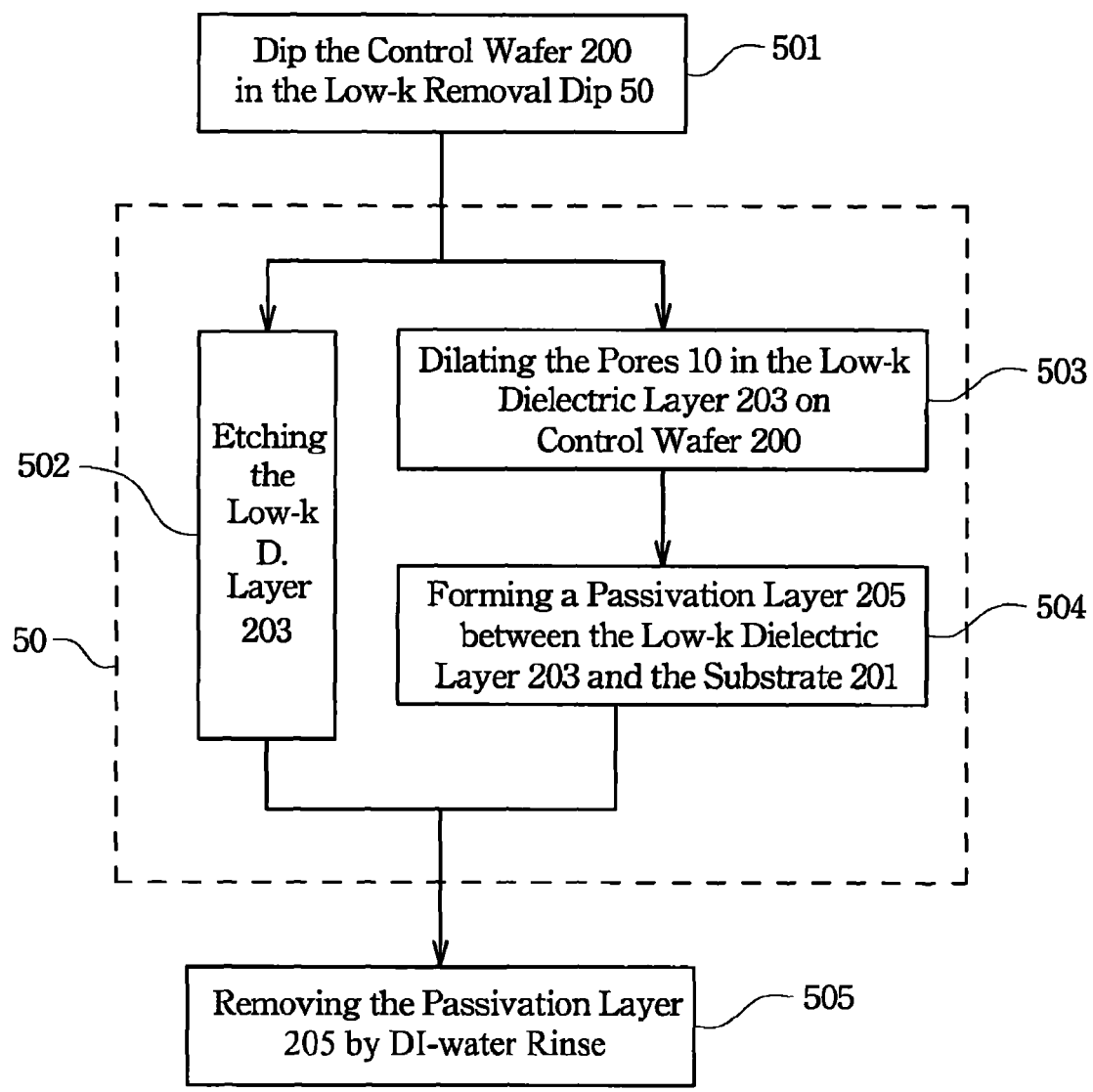
FIG. 5 is a flow chart illustrating the method of FIG. 3.
Figure 6:
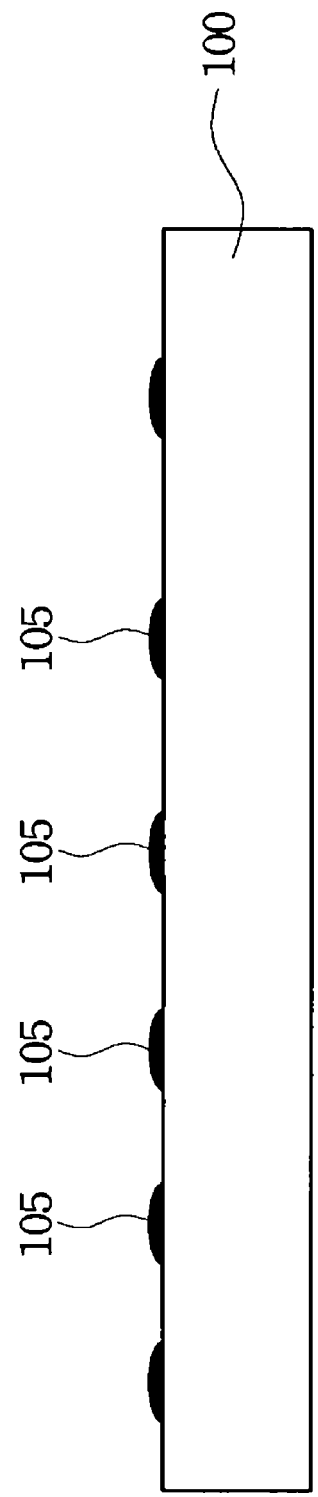
FIG. 6 is a cross-sectional view of a control wafer according to a conventional procedure for reclaiming a control wafer.

FIG. 5 is a flow chart 500 illustration of the method of removing a low-k dielectric layer from a substrate as described above. A control wafer is dipped in an hydrofluoric acid-based low-k removal solvent for about 600 sec at about 60° C. (See box 501). During the dip cycle 50, while the hydrofluoric acid-based solvent etches away the low-k dielectric material 203 (see box 502), the dilating additive 310 component of the hydrofluoric acid-based solvent dilates the pores 10 in the low-k dielectric layer 203 on the control wafer 200. (See box 503). Some of the dilating pores connect with one another and form a plurality of channels 15, extending through the thickness of the low-k dielectric layer 203. The hydrofluoric acid-based solvent comes in contact with the semiconductor wafer substrate 201 through the channels 15 and the passivating additive 320 form an organic passivation layer 205 at the interface between the low-k dielectric layer 203 and the substrate 201. (See box 504). By the end of the low-k dielectric removal dip cycle, the low-k dielectric layer 203 has been completely etched away. Next, the passivation layer 205 is removed by a quick de-ionized water rinse (QDR). (See box 505).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An etchant for removing a porous low-k dielectric layer on a semiconductor substrate, the low-k dielectric layer containing a plurality of pores, the etchant comprising:

a hydrofluoric acid-based solvent, wherein the hydrofluoric acid-based solvent comprises one of halo-hydrocarbon, halo-aromatic compounds or hydro-aromatic compounds;

a dilating additive for dilating the pores in the porous low-k dielectric layer, wherein the dilating additive comprises a glycol ether; and a passivating additive that forms a passivation layer at the interface between the low-k dielectric layer and the semiconductor substrate, wherein the passivating additive comprises one of PEG poly(ethylene glycol), EG (Ethylene Glycol), 1,4-dioxane, or Glycerin.

2. The etchant of claim 1, wherein the etchant comprises HF; 1,4-dioxane; 1-(2-butoxyethoxy)ethanol, butoxydiglycol (BDG), or sulfolane.

3. The etchant of claim 1, wherein the hydrofluoric acid-based solvent further comprises an oxidizer.

4. The etchant of claim 3, wherein the dilating additive comprises 1-(2-butoxyethoxy)ethanol and butoxydiglycol (BDG), Diethylene Glycol Monomethyl Ether ($CH_3$—$(OCH_2CH_2)_2$—OH) (MDG), or Polyethylene-Glycol Monomethyl Ether ($CH_3$—$(OCH_2CH_2)_n$—OH) (MPG).

5. The etchant of claim 3, wherein the oxidizer comprises one of Pyridinium chlorochromate (PCC) $C_5H_5NHClCrO_3$; Pyridinium dichromate (PDC) $(C_5H_5NH)_2Cr_2O_7$; persulfuric acid, sulfolane; and inorganic compounds.

6. The etchant of claim 5, wherein the dilating additive comprises 1-(2-butoxyethoxy)ethanol and butoxydiglycol (BDG), Diethylene Glycol Monomethyl Ether ($CH_3$—$(OCH_2CH_2)_2$—OH) (MDG), or Polyethylene-Glycol Monomethyl Ether ($CH_3$—$(OCH_2CH_2)_n$—OH) (MPG).

7. The etchant of claim 5, wherein the inorganic compounds comprise one of $HNO_3$; $H_2O_2$; or $H_2SO_5$.

* * * * *